(12) United States Patent
Seo

(10) Patent No.: US 10,325,871 B2
(45) Date of Patent: Jun. 18, 2019

(54) DISPLAY DEVICE

(71) Applicant: Samsung Display Co., Ltd., Yongin-si, Gyeonggi-do (KR)

(72) Inventor: Hae-Kwan Seo, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 527 days.

(21) Appl. No.: 14/948,114

(22) Filed: Nov. 20, 2015

(65) Prior Publication Data

US 2016/0300548 A1   Oct. 13, 2016

(30) Foreign Application Priority Data

Apr. 8, 2015   (KR) .................. 10-2015-0049842

(51) Int. Cl.
*H01L 23/00*  (2006.01)
*G02F 1/1345*  (2006.01)
*H01L 25/065*  (2006.01)

(52) U.S. Cl.
CPC .......... *H01L 24/13* (2013.01); *G02F 1/13452* (2013.01); *H01L 24/06* (2013.01); *H01L 25/0655* (2013.01); *H01L 24/16* (2013.01); *H01L 2224/06133* (2013.01); *H01L 2224/06134* (2013.01); *H01L 2224/06138* (2013.01); *H01L 2224/13099* (2013.01)

(58) Field of Classification Search
CPC ....... H01L 2224/06134; H01L 23/4985; H01L 2224/32225; H01L 2224/16225; H01L 2224/73205; G02F 1/1345; G02F 1/13452; G09G 2300/023
See application file for complete search history.

(56) References Cited

U.S. PATENT DOCUMENTS

| | | | | |
|---|---|---|---|---|
| 2003/0209713 | A1* | 11/2003 | Kimura | .................. H01L 24/73 257/72 |
| 2004/0080032 | A1* | 4/2004 | Kimura | ............... H01L 21/6835 257/678 |
| 2014/0240566 | A1* | 8/2014 | Shizukuishi | ...... H01L 27/14634 348/302 |
| 2015/0340419 | A1* | 11/2015 | Li | ..................... G02F 1/136227 257/40 |

FOREIGN PATENT DOCUMENTS

| | | |
|---|---|---|
| KR | 10-2001-0045248 A | 6/2001 |
| KR | 10-2014-0108845 A | 9/2014 |
| KR | 10-2014-0129847 A | 11/2014 |

* cited by examiner

*Primary Examiner* — Nathan W Ha
(74) *Attorney, Agent, or Firm* — F. Chau & Associates, LLC

(57) ABSTRACT

A display device comprises a control circuit board generating a first control signal; a driver chip package connected to the control circuit board and receiving the first control signal; and a display panel connected to the driver chip package interconnecting the control circuit board and the display panel. The display panel comprises pixels formed and signal lines connected to the pixels. The driver chip package comprises a wire film and a driver chip attached over the wire film. The driver chip is fixed to the display panel to transfer the second control signal to at least one of the plurality of signal lines. The wire film interconnects the driver chip and the control circuit board to transfer the first control signal from the control circuit board to the driver chip.

20 Claims, 9 Drawing Sheets

DISPLAY DEVICE

CROSS-REFERENCE TO RELATED APPLICATION

This application claims priority to and the benefit of Korean Patent Application No. 10-2015-0049842 filed in the Korean Intellectual Property Office on Apr. 8, 2015, the entire contents of which are incorporated herein by reference.

BACKGROUND (a) Technical Field

The present disclosure relates to a display device, and more particularly, to flat panel display.

(b) Discussion of the Related Technology

Generally, a flat panel display includes a substrate over which an array of pixels is formed to display an image, and a display driver chip of the display device which generates a control signal such as an image signal to transfer the control signal to the pixel.

The display driver chip receives a source signal from a control circuit board, generates the control signal based on the source signal and outputs the control signal to the pixel side through the output terminal toward the pixels.

The above information disclosed in this Background section is only for enhancement of understanding of the background of the invention and therefore it may contain information that does not form the prior art that is already known in this country to a person of ordinary skill in the art.

SUMMARY

One aspect of the present invention provides a display device having advantages of simplifying a layout of display driver chips and improving a higher resolution.

Another aspect of the invention provides a display device, which may comprise: a control circuit board configured to generate at least one control signal comprising a first control signal; a driver chip package connected to the control circuit board and configured to receive the first control signal from the control circuit board; and a display panel connected to the driver chip package which interconnects the control circuit board and the display panel, the display panel comprising a display area and a peripheral area surrounding the display area, the display panel comprising a plurality of pixels formed in the display area and a plurality of signal lines formed in the peripheral area and connected to the plurality of pixels, wherein the driver chip package comprises a wire film and a driver chip attached over the wire film, the driver chip comprising a first surface facing the display panel and a second surface facing the wire film and configured to generate a second control signal based on the first control signal, wherein the driver chip is fixed to the display panel to transfer the second control signal to at least one of the plurality of signal lines, wherein the wire film interconnects the driver chip and the control circuit board to transfer the first control signal from the control circuit board to the driver chip.

In the foregoing device, the driver chip may comprise: a first operation unit configured to generate the second control signal and comprising an input terminal for receiving the first control signal and an output terminal for transmitting the second control signal, at least a first chip pad connected to the output terminal of the first operation unit and formed on the first surface of the driver chip, and at least a second chip pad connected to the input terminal of the first operation unit and formed on the second surface of the driver chip, and wherein the plurality of signal lines of the display panel comprises a plurality of data lines, each of which comprises one end connected to one of the pixels, and a terminal pad formed at the other end and connected to the first chip pad. The wire film may comprise: a wire film body formed by a flexible film, and a plurality of signal lines formed over a surface of the wire film body and each comprising a first connection pad and a second connection pad, wherein the first connection pad and the second connection pad are connected to the second chip pad and a terminal pad of the control circuit board, respectively. The wire film may further comprise an insulating layer covering the signal lines. A bump may be formed between the first chip pad and the first connection pad of the signal line of the wire film. A bump may be formed between the second chip pad and the terminal pad of the signal line of the display panel.

Still in the foregoing device, a through silicon via may be formed between the first operation unit and at least one of the first and second chip pads. The display panel may further comprise an auxiliary circuit formed in the peripheral area and connected to the plurality of pixels and an auxiliary circuit signal line interconnecting the auxiliary circuit and the driver chip package, wherein the control circuit board is configured to generate a third control signal and configured to transfer the third control signal to the driver chip package, and wherein the driver chip package is configured to generate a fourth control signal base on the third control signal and configured to transfer the fourth control signal to the auxiliary circuit signal line. The driver chip may further comprise: a second operation unit configured to generate the fourth control signal based on the third control signal, at least a third chip pad formed on the first surface of the driver chip and configured to transfer the fourth control signal to the auxiliary circuit signal line, and at least a fourth chip pad formed on the second surface of the driver chip and configured to transfer the third control signal to the second operation unit, and wherein the auxiliary circuit signal line includes a plurality of auxiliary circuit data lines, each of which comprises one end connected to the auxiliary circuit, and another terminal pad connected to the third pad.

Yet in the foregoing device, the driver chip may comprise: a fifth chip pad formed on the first surface of the driver chip to be connected to the display panel, a sixth chip pad formed on the second surface of the driver chip to be connected to the wire film, and a conductor filler passing through the driver chip and interconnecting the fifth chip pad and the sixth pad, and wherein the control circuit board is configured to generate a fifth control signal, and the sixth chip pad, the conductor filler and the fifth chip pad are configured to transfer the fifth control signal the display panel. The device may further comprise an auxiliary wire film which connects the control circuit board and the display panel and is configured to directly transfer a sixth control signal generated from the control circuit board to the display panel. The display device may be configured to transfer the sixth control signal from the control circuit board to the display panel without passing the driver chip package. The auxiliary wire film may comprise one end fixed to the display panel and located between an edge of the display panel and the driver chip. The display area may comprise a first sub display area formed at a part of the display area and a second sub display area formed at another part except for the part formed with the first sub display area, and wherein an additional driver chip package is provided, the driver chip package is connected to a plurality of pixels formed in the first sub display area through the signal lines, and the additional chip package is connected to the pixels formed in the second sub display area through the signal lines. The auxiliary wire film may overlap the wire film.

Further in the foregoing device, the driver chip may be electrically connected to the control circuit board via the wire film. The driver chip does not directly contact the control circuit board. The display panel may be electrically connected to the control circuit board via the driver chip package. The display panel does not directly contact the control circuit board. The driver chip may be sandwiched between the display panel and the wire film.

An embodiment of the present invention provides a display device including: a control substrate generating at least one control signal; a driver chip package of which one side is connected to the control substrate and to which a first control signal generated from the control substrate is input; and a display substrate connected to the other side of the driver chip package, formed with a display area and a peripheral area surrounding the display area, and including a plurality of pixels formed in the display area and signal lines formed in the peripheral area and connected to the plurality of pixels, in which the driver chip package includes a driver chip which has a first surface and a second surface facing the first surface in an opposite direction and generates a second control signal based on the first control signal and of which the first surface is fixed to the display substrate to transfer the second control signal to the signal line, and a wire film of which one side is connected to the second surface of the driver chip and the other side is connected to the control substrate to transfer the first control signal from the control substrate to the driver chip.

The driver chip may include a first operation unit which generates the second control signal and includes an input terminal to which the first control signal is input and an output terminal to which the second control signal is output, a plurality of first pads which is connected to the output terminal of the first operation unit and formed on the first surface of the driver chip, and a plurality of second pads which is connected to the input terminal of the first operation unit and formed on the second surface of the driver chip, and the plurality of signal lines may include a plurality of data lines which is formed on the display substrate and of which one end is connected to the pixel, and a pad at the signal line side which is formed at the other end of the data line and to which the first pad is connected.

The wire film may include a wire film body formed by a flexible film and a signal line at the wire film side including a first pad at the wire film side and a second pad at the wire film side which are formed on one surface of the wire film body and spaced apart from one side and the other side based on the center of the wire film body, and the first pad at the wire film side and the second pad at the wire film side may be connected to the second pad of the driver chip and the pad at the control substrate side formed on the control substrate.

The wire film may further include an insulating layer at the wire film side covering one surface of the signal line at the wire film side except for the first pad at the wire film side and the second pad at the wire film side.

Bumps may be formed between the first pad and the pad at the signal line side and between the second pad and the first pad at the wire film side.

At least one of the connected between the first pad and the first operation unit and the connection between the second pad and the second operation unit may be formed by a through silicon via.

The display substrate may further include an auxiliary circuit formed in the peripheral area and connected to the pixel and an auxiliary circuit signal line of which one end is connected to the auxiliary circuit and the other end is connected to the driver chip package, the control substrate may generate a third control signal to transfer the third control signal to the driver chip package, and the driver chip package may generate a fourth control signal base on the third control signal to transfer the fourth control signal to the auxiliary circuit signal line.

The driver chip may include a second operation unit for generating the fourth control signal based on the third control signal, a plurality of third pads which is formed on the first surface of the driver chip and transfers the fourth control signal to the auxiliary circuit signal line, and a plurality of the fourth pads which is formed on the second surface of the driver chip and transfers the third control signal to the second operation unit, and the auxiliary circuit signal line may include a plurality of auxiliary circuit data lines which is formed on the display substrate and of which one end is connected to the auxiliary circuit, and a pad at the auxiliary circuit signal line side which is formed at the other end of the auxiliary circuit data line and connected to the third pad.

The driver chip may include a fifth pad which is formed on the first surface of the driver chip to be connected to the display substrate, a sixth pad formed on the second surface of the driver chip to be connected to the wire film, and a conductor filler which passes through the driver chip and of which one end is connected to the fifth pad and the other end is connected to the sixth pad, and the control substrate may generate a fifth control signal, and the fifth control signal may be transferred to the display substrate through the sixth pad, the conductor filler, and the fifth pad.

The display device may further include an auxiliary wire film which connects the control substrate and the display substrate and directly transfers a sixth control signal generated from the control substrate to the display substrate.

A position of a connection pad of the display substrate to which one side of the auxiliary wire film is connected may be more adjacent to an edge side of the display substrate than a position of a connection pad of the display substrate to which one side of the driver chip package is connected, and a position of the connection pad of the control substrate to which the other side of the auxiliary wire film is connected may be more adjacent to an edge side of the control substrate than a position of the connection pad of the control substrate to which the other side of the driver chip package is connected.

The display area may include a first sub display area formed at a part of the display area and a second sub display area formed at another part except for the part formed with the first sub display area, and a plurality of driver chip packages is provided, one among the driver chip packages may be connected to a pixel formed in the first sub display area through the signal line, and other driver chip packages except for one driver chip package may be connected to a pixel formed in the second sub display area through the signal line.

As described above, in the display device according to the embodiment of the present invention, a larger amount of data may be transceived from a control substrate by forming connection pads on both a first surface and a second surface of the driver chip. As a result, it is possible to improve a higher resolution in the display device.

Further, it is possible to increase manufacturing efficiency of the display device as the layout of the driver chips is simplified.

DETAILED DESCRIPTION OF EMBODIMENTS

Figure 1:
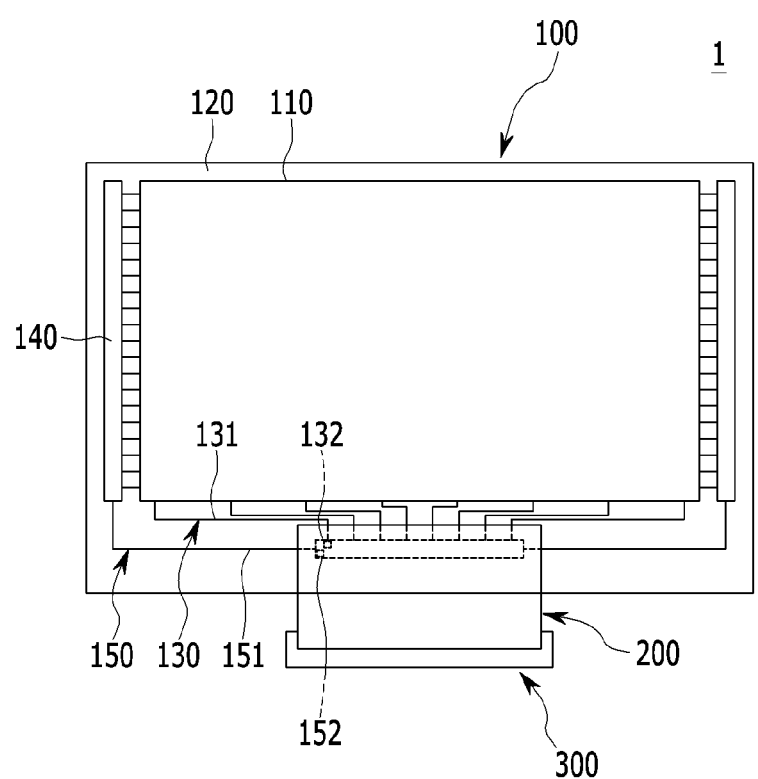
FIG. 1 is a diagram illustrating the display device according to an embodiment of the present invention.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification. In addition, the size and thickness of each configuration shown in the drawings are arbitrarily shown for understanding and ease of description, but the present invention is not limited thereto.

Further, in the specification, the word "on" means positioning on or below the object portion, but does not essentially mean positioning on the upper side of the object portion based on a gravity direction. In addition, unless explicitly described to the contrary, the word "comprise" and variations such as "comprises" or "comprising", will be understood to imply the inclusion of stated elements but not the exclusion of any other elements.

Generally, the display driver chip is provided in a chip-on-glass (COG) form of which one side is fixed to a substrate side or in a chip-on-film (COF) form in which one side is fixed to a film wire.

A plurality of input terminals and a plurality of output terminals are formed on one surface of the display driver chip, and the display driver chip receives a source signal for generating the control signal from a control circuit board through the input terminal. In addition, the display driver chip generates the control signal based on the source signal and outputs the control signal to the pixel side through the output terminal.

With development of an image processing technique, the demand of a high-resolution display device is increased, and a bandwidth of image signal data which are input and output to the display driver chip is also increased.

According to the increase of the data bandwidth, a layout of display driver chips becomes more complicated. Thus, the structure of the display panel is complicated and manufacturing cost is increased.

Further, in the case of implementing a high resolution in a small substrate, there is a limitation to a layout area of the display driver chip and thus it is difficult to implement the high-resolution display.

Hereinafter, a display device according to embodiments of the present invention will be described in detail with reference to the accompanying drawings.

Figure 2:
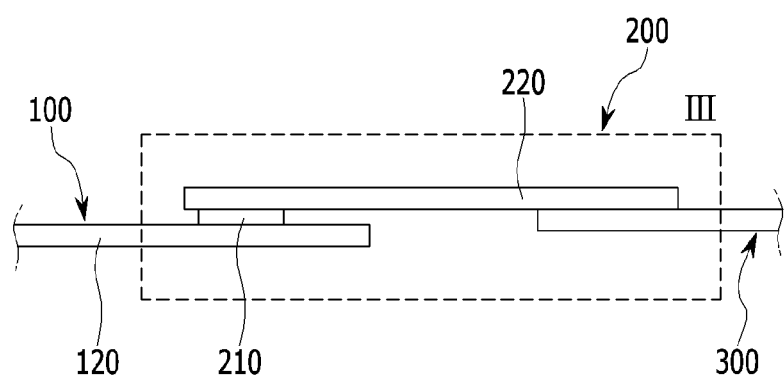
FIG. 2 is a side view of the display device of FIG. 1.
Figure 3:
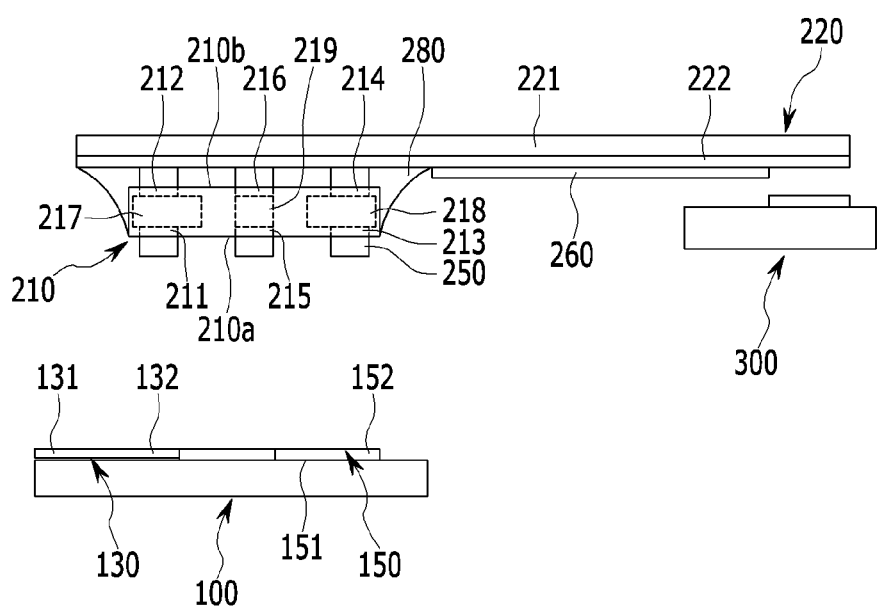
FIG. 3 is an enlarged diagram of a part III of FIG. 2.
Figure 4:
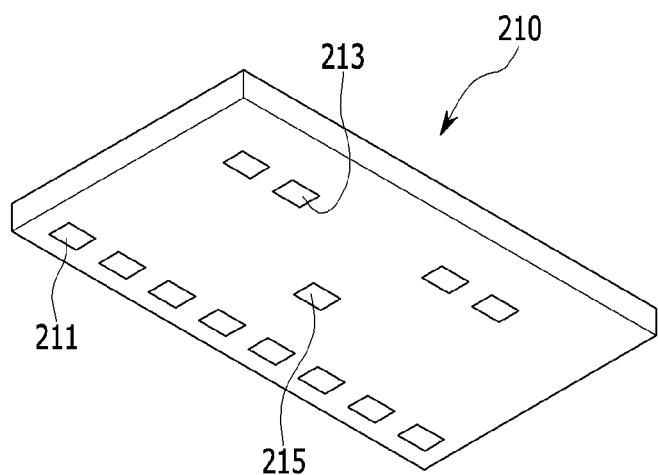
FIG. 4 is a diagram illustrating a lower surface of a driver chip of FIG. 3.
Figure 5:
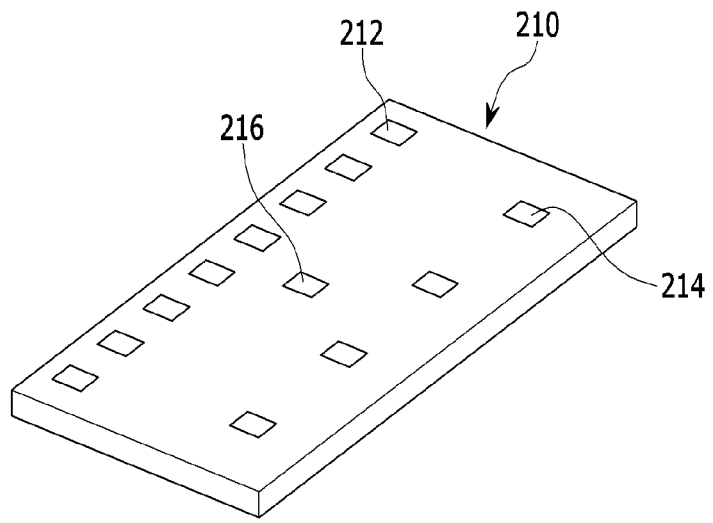
FIG. 5 is a diagram illustrating an upper surface of the driver chip of FIG. 3.
Figure 6:
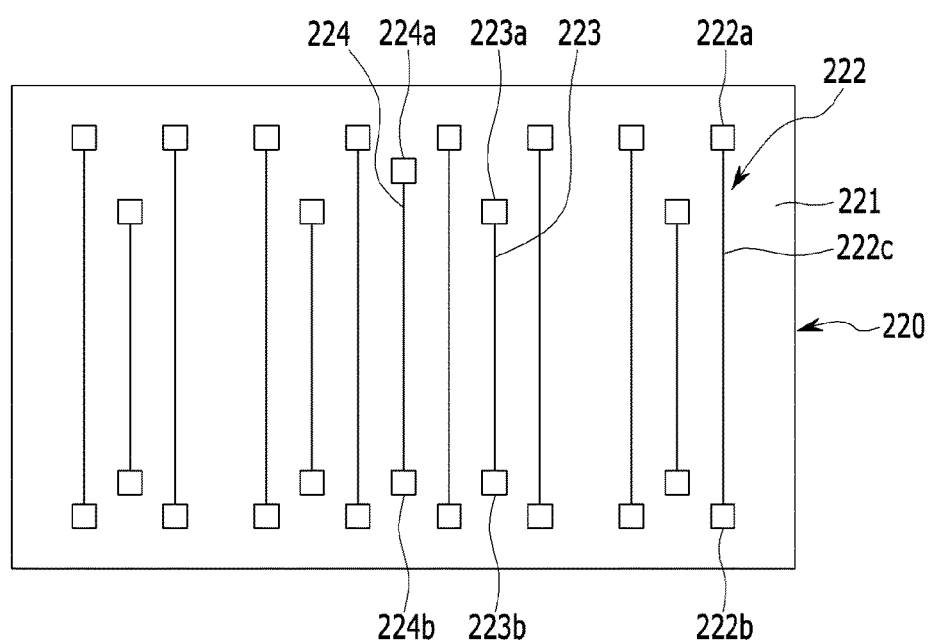
FIG. 6 is a diagram illustrating a wire film of FIG. 3.
Figure 7:
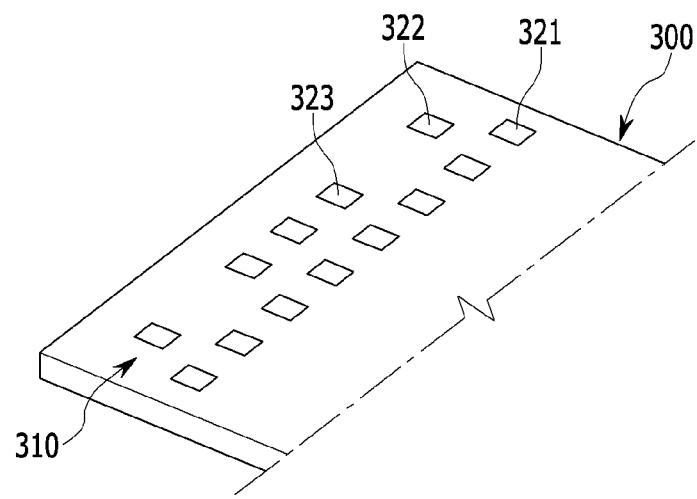
FIG. 7 is a diagram illustrating a control circuit board of FIG. 3.

FIG. 1 is a diagram illustrating the display device according to an embodiment of the present invention, and FIG. 2 is a side view of the display device of FIG. 1. FIG. 3 is an enlarged diagram of a part III of FIG. 2, FIG. 4 is a diagram illustrating a lower surface of a driver chip of FIG. 3, and FIG. 5 is a diagram illustrating an upper surface of the driver chip of FIG. 3. FIG. 6 is a diagram illustrating a wire film of FIG. 3, and FIG. 7 is a diagram illustrating a control circuit board of FIG. 3.

Referring to FIGS. 1 to 7, a display device 1 according to the embodiment as a device displaying an image may be, for example, a liquid crystal display (LCD) or an organic light emitting diode display (OLED Display).

The display device 1 includes a display substrate or display panel 100 displaying an image, a control substrate or control circuit board 300 generating a plurality of control signals for displaying the image, and a driver chip package 200 connecting the display panel 100 and the control circuit board 300.

The display panel 100 is formed as a planar panel, and includes a display area 110, and a peripheral area 120. The display panel includes an array of pixels, a plurality of signal lines 130, an auxiliary circuit 140, and an auxiliary circuit signal line 150.

In more detail, in the display area 110, a plurality of pixels is formed to display the image and positioned at the center of the display panel 100.

The peripheral area 120 surrounds the display area 110 and forms an edge of the display panel 100. In addition, in the peripheral area 120, the signal line 130, the auxiliary circuit 140, and the auxiliary circuit signal line 150 are formed.

The plurality of signal lines 130 is formed at a lower side of the display area 110. Each signal line 130 includes a data line 131 which is formed on the display panel 100 and of which one end is connected to the pixel, and a pad 132 at the signal line side formed at the other end of the data line 131.

The auxiliary circuit 140 may be formed at both sides of the display area 110 and is connected to the pixel formed in the display area 110. The auxiliary circuit 140 exemplarily generates a scan signal and an emission control signal to transfer the signals to the pixel of the display area 110.

The auxiliary circuit signal line 150 includes an auxiliary circuit data line 151 which is formed on the display substrate and of which one end is connected to the auxiliary circuit 140, and a pad 152 at the auxiliary circuit signal line side 152 formed at the other end of the auxiliary circuit data line 151.

Meanwhile, the driver chip package 200 receives the control signal generated in the control circuit board 300 and generates a new control signal based on the control signal to transfer the new control signal to the display panel 100 or transfer the control signal generated in the control circuit board 300 to the display panel 100 again.

The driver chip package 200 includes a driver chip 210, a wire film or a flexible wire board 220, and a sealing resin 280.

In more detail, the driver chip 210 as a semiconductor chip has a first surface 210a and a second surface 210b facing away from the first surface 210a. The chip 210 includes a first operation unit 217, a second operation unit 218, and a conductor filler 219 which are formed inside a chip, a first pad 211, a third pad 213, and a fifth pad 215 which are formed on the first surface 210*a* of the driver chip 210, and a second pad 212, a fourth pad 214, and a sixth pad 216 formed on the second surface 210*b* of the driver chip 210.

The first operation unit 217 generates a second control signal S2 based on a first control signal S1 generated in the control circuit board 300. The first operation unit 217 has an input terminal and an output terminal, the output terminal of the first operation unit 217 is connected to the first pad 211, and the input terminal of the first operation unit 217 is connected to the second pad 212.

The second operation unit 218 generates a fourth control signal S4 based on a third control signal S3 generated in the control circuit board 300. The second operation unit 218 has an input terminal and an output terminal, the output terminal of the second operation unit 218 is connected to the third pad 213, and the input terminal of the second operation unit 218 is connected to the fourth pad 214, like the first operation unit 217.

The conductor filler 219 may be formed in a shape passing through an inner portion of the driver chip 210, the fifth pad 215 is connected to one end of the conductor filler 219, and the sixth pad 216 is connected to the other end of the conductor filler 219.

In embodiments, in the driver chip 210 of the display device 100 according to the embodiment of the present invention, a plurality of pads which may be connected to other configurations on both the first surface 210*a* which is a lower surface and the second substrate 210*b* which is an upper surface is formed.

The driver chip 210 of the display device 100 according to the embodiment may be, for example, a flip chip or a semiconductor chip which is formed by a through silicon via (hereinafter, referred to as a TSV) process or a wafer level package process.

For example, connection between the first pad 211 and the first operation unit 217 of the driver chip 210 according to the embodiment or connection between the second pad 212 and the first operation unit 217 may be formed by the TSV.

The first pad 211 of the driver chip 210 is connected to the pad 132 at the signal line side of the signal line 130, and the third pad 213 is connected to the pad 152 at the auxiliary circuit signal line side of the auxiliary circuit signal line 150.

The fifth pad 215 may be connected to a pad at the power signal line side formed at an end of a power signal line. The power signal line is connected to the auxiliary circuit 140 of the display area 110 to transfer to the auxiliary circuit 140 a control signal having a voltage having a predetermined magnitude or more.

Hereinafter, a configuration of the wire film 220 will be described in detail.

The driver chip 210 is connected to one side of the wire film 220 and the other side of the wire film 220 is connected to the control circuit board 300 to transfer the control signals generated in the control circuit board 300 to the driver chip 210.

The wire film 220 includes a wire film body 221, a plurality of signal lines 222, 223, and 224 at the wire film side, and an insulating layer 260 at the wire film side.

The wire film body 221 is formed by, for example, a flexible film made of a polyimide material having one surface and a rear surface, and the second surface 210*b* of the driver chip 210 is fixed to one side of the wire film body 221.

The plurality of signal lines 222, 223, and 224 at the wire film side is formed on one surface of the wire film body 221 and includes a signal line 222 at the first wire film side, a signal line 223 at the second wire film side, and a signal line 224 at the third wire film side.

In embodiments, each of the signal lines 222, 223 and 224 includes an elongated conductive line and two connection pads disposed at the ends of the conductive line. The signal lines 222, 223 and 224 may have different length.

For example, the signal line 222 at the first wire film side includes a first pad 222*a* at the first wire film signal line side and a second pad 222*b* at the first wire film signal line side which are spaced apart from one side and the other side of the wire film body 221 based on the center of the wire film body 221, and a data line 222*c* at the first wire film signal line side connecting the first pad 222*a* at the first wire film signal line side and the second pad 222*b* at the first wire film signal line side. The first pad 222*a* at the first wire film signal line side is connected to the second pad 212 of the driver chip 210.

The signal line 223 at the second wire film signal line side includes a first pad 223*a* at the second wire film signal line side, a second pad 223*b* at the second wire film signal line side, and a data line 223*c* at the second wire film signal line side, and the signal line 224 at the third wire film signal line side includes a first pad 224*a* at the third wire film signal line side, a second pad 224*b* at the third wire film signal line side, and a data line 224*c* at the third wire film signal line side.

The first pad 223*a* at the second wire film signal line side is connected to the fourth pad 214 of the driver chip 210, and the first pad 224*a* at the third wire film signal line side is connected to the sixth pad 216 of the driver chip 210.

Since the configuration of the signal line 223 at the second wire film side and the signal line 224 at the third wire film side is substantially the same as the configuration of the signal line 222 at the first wire film side, the detailed description thereof will be omitted.

A bump 250 is provided between the pads of the display panel 100 and the first pad 211, the third pad 213, and the fifth pad 215 of the driver chip 210 to firmly connect the pads to each other.

Similarly, a bump 250 is provided between the second pad 212, the fourth pad 214, and the sixth pad 216 of the driver chip 210 and the pads 222*a*, 223*a*, and 224*a* of the wire film 220.

In addition, an insulating layer 260 at the wire film side is formed at the remaining area of one surface of the wire film body 211 except for the plurality of pads 222*a*, 222*b*, 223*a*, 223*b*, 224*a*, and 224*b* at the wire film side to be prevented from being soldered in an undesired region during a soldering process.

The sealing resin 280 is coated on one side of the wire film body 211 to firmly fix the driver chip 210 to one side of the wire film body 211.

Hereinafter, a configuration of the control circuit board 300 will be described in detail.

The control circuit board 300 includes a control circuit board body 310 having a plate shape which is for example, a printed circuit board, and a plurality of pads 321, 322, and 323 at the control circuit board side disposed at the one side of the control circuit board body 310.

The plurality of pads 321, 322, and 323 at the control circuit board side includes a first pad 321 at the control circuit board side, a second pad 322 at the control circuit board side, and a third pad 323 at the control circuit board side.

The first pad 321 at the control circuit board side, the second pad 322 at the control circuit board side, and the third pad 323 at the control circuit board side are connected to the second pad 222a at the first wire film signal line side, the second pad 223a at the second wire film signal line side, and the second pad 224a at the third wire film signal line side of the wire film 220, respectively.

Between the pads 321, 322, and 323 at the control circuit board side and the second pads 222a, 223a, and 224a at the wire film signal line side, solders ball or bumps may be provided.

Hereinafter, a process of transferring the control signals generated in the control circuit board 300 to the display panel 100 will be described.

The first control signal S1, the third control signal S3, and the fifth control signal S5 are generated in the control circuit board 300.

First, the first control signal S1 is output from the first pad 321 at the control circuit board side of the control circuit board 300 to be input to the first operation unit 217 of the driver chip 210 through the signal line 222 at the first wire film side.

The first operation unit 217 generates the second control signal S2 based on the first control signal S1, and the second control signal S2 is output to the first pad 211 of the driver chip 210.

The second control signal S2 output from the first pad 211 of the driver chip 210 is input to the pixel of the display area 110 through the signal line 130.

The third control signal S3 is output from the second pad 322 at the control circuit board side of the control circuit board 300 to be input to the second operation unit 218 of the driver chip 210 through the signal line 223 at the second wire film side.

The second operation unit 218 generates the fourth control signal S4 based on the third control signal S3, and the fourth control signal S4 is output to the third pad 213 of the driver chip 210.

The fourth control signal S4 output from the third pad 213 of the driver chip 210 is input the auxiliary circuit 140 formed in the peripheral area 120 through the signal line 150 at the auxiliary circuit side.

The fifth control signal S5 is output from the third pad 323 at the control circuit board side of the control circuit board 300 to be output to the fifth pad 215 through the signal line 224 at the third wire film side and the conductor filler 219 of the driver chip 210.

The fifth control signal S5 output from the fifth pad 215 of the driver chip 210 is input to the auxiliary circuit 140 through the power signal line.

The first control signal S1 and the second control signal S2 of the display device 1 according to the embodiment may be image signals, and the third control signal S3 and the fourth control signal S4 may be auxiliary circuit driving signals. Further, the fifth control signal S5 may be a power signal having a higher voltage value than the first control signal S1 to the fourth control signal S4.

According to the proposed embodiment, the connection pads are formed on both the first surface 210a and the second surface 210b of the driver chip 210 to transceive a larger amount of data from the control circuit board 300. As a result, it is possible to improve a higher resolution in the display device 1.

Further, it is possible to increase manufacturing efficiency of the display device 1 as the layout of the driver chip 210 is simplified.

Further, heat generated inside the driver chip 210 is emitted to the outside through the signal lines made of a conductor material which are connected to the first surface 210a and the second surface 210b of the driver chip 210 and thus heat dispersion of the driver chip 210 may be more easily performed.

Figure 8:
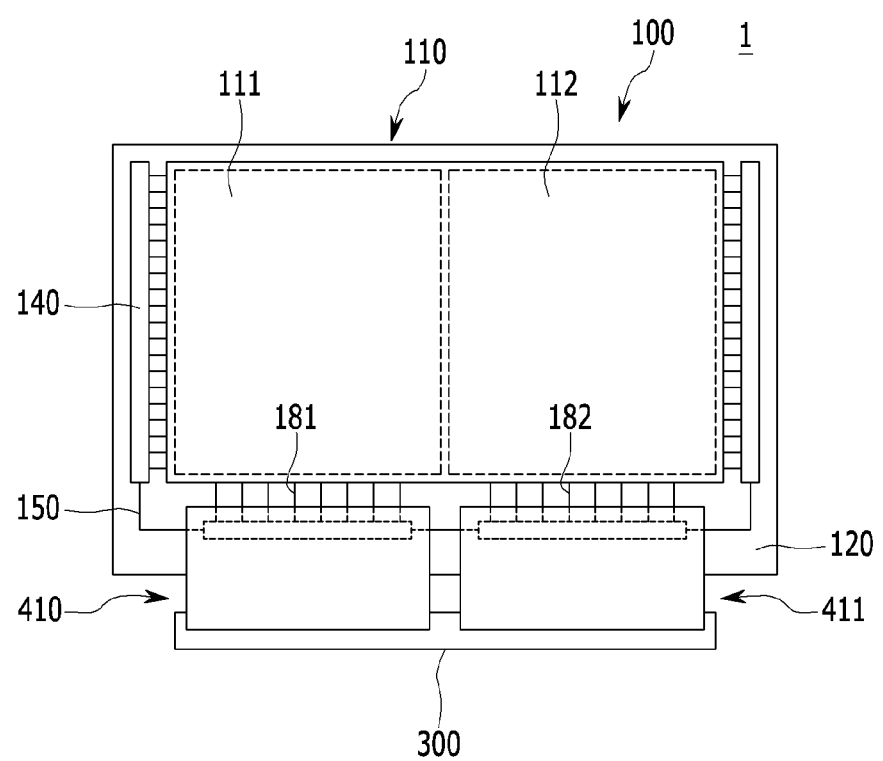
FIG. 8 is a diagram illustrating a display device according to another embodiment of the present invention.

FIG. 8 is a diagram illustrating a display device according to another embodiment of the present invention.

In a display device according to the embodiment, since configurations of a display area, a driver chip package, and a signal line are different from the configurations of FIGS. 1 to 7 and other configurations are substantially the same as the configurations of FIGS. 1 to 7, hereinafter, discriminative features of the embodiment will be mainly described.

Referring to FIG. 8, the display device 1 according to the embodiment includes a display area 110 including a first sub display area 111 and a second sub display area 112 in which a plurality of pixels is formed, a first driver chip package 410, a second driver chip package 411, a first signal line 181, and a second signal line 182.

The first sub display area 111 is formed at a part of the display area 110, and the second sub display area 112 is formed at another part except for the part where the first sub display area 111 is formed.

The first driver chip package 410 is connected to the pixel formed in the first sub display area 111 through the first signal line 181 to transfer a control signal to the pixel.

Similarly, the second driver chip package 411 is connected to the pixel formed in the second sub display area 112 through the second signal line 182 to transfer a control signal to the pixel.

In the embodiment, it is described that the sub display areas are two, but a configuration in which the sub display areas are three or more may be also included in the spirit of the present invention.

Figure 9:
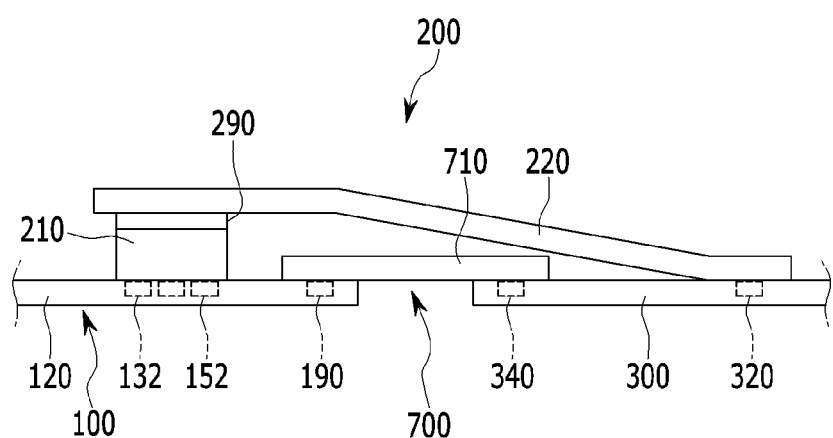
FIG. 9 is a schematic plan view of a display device according to yet another embodiment of the present invention.

FIG. 9 is a schematic plan view of a display device according to yet another embodiment of the present invention.

In a display device according to the embodiment, since a configuration having an auxiliary wire film is different from the configuration of FIGS. 1 to 7 and other configurations are substantially the same as the configurations of FIGS. 1 to 7, hereinafter, discriminative features of the embodiment will be mainly described.

Referring to FIG. 9, the display device 1 according to the embodiment includes an auxiliary wire film 700.

The auxiliary wire film 700 directly connects the control circuit board 300 and the display panel 100, and a sixth control signal S6 generated from the control circuit board 300 is directly transferred to the display panel 100.

The auxiliary wire film 700 includes, for example, a flexible auxiliary wire film body 710 made of a polyimide material and a plurality of signal lines at the auxiliary wire film side formed on one surface of the auxiliary wire film body 710.

One side of the auxiliary wire film body 710 is connected to the peripheral area 120 of the display panel 100 and the other side of the auxiliary wire film body 710 is connected to the control circuit board 300.

In the peripheral area 120 of the display panel 100, a connection pad 190 at the display substrate side to which one side of the signal line at the auxiliary wire film side is connected, and on the control circuit board 300, a connection pad 340 at the control circuit board side to which the other side of the signal line at the auxiliary wire film side is connected.

The connection pad 190 at the display substrate side is positioned to be more adjacent to the edge side of the display panel 100 than the pads 132 and 152 at the signal line side to which the driver chip 120 is connected.

In addition, the connection pad 340 at the control circuit board side is positioned to be more adjacent to the edge side of the control circuit board 300 than the pad 320 at the control circuit board side to which the other side of the wire film 220 of the driver chip package 200 is connected.

Accordingly, while the wire film 700 is connected to the display panel 100 and the control circuit board 300, the wire film 700 is positioned to be separated by a predetermined distance at the lower side of the driver chip package 200 to prevent interference between the driver chip package 200 and the wire film 700.

In this case, the driver chip 210 of the driver chip package 200 may include a separation part 290 for increasing a height of the upper surface of the driver chip 210 in order to more suppress the interference between the driver chip package 200 and the wire film 700.

The separation part 290 is positioned at an upper side of the driver chip 210 and may be, for example, a bump, a solder ball, or an insulating layer which has a predetermined height.

While embodiments of this invention are described, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a control circuit board configured to generate at least one control signal comprising a first control signal;
   a driver chip package connected to the control circuit board and configured to receive the first control signal from the control circuit board; and
   a display panel connected to the driver chip package which interconnects the control circuit board and the display panel, the display panel comprising a display area and a peripheral area surrounding the display area, the display panel comprising a plurality of pixels formed in the display area and a plurality of signal lines formed in the peripheral area and connected to the plurality of pixels,
   wherein the driver chip package comprises a wire film and a driver chip attached over the wire film, the driver chip comprising a first surface facing the display panel and a second surface facing the wire film and configured to generate a second control signal based on the first control signal, wherein the driver chip is fixed to the display panel to transfer the second control signal to at least one of the plurality of signal lines, wherein the wire film interconnects the driver chip and the control circuit board to transfer the first control signal from the control circuit board to the driver chip.

2. The display device of claim 1, wherein the driver chip comprises:
   a first operation unit configured to generate the second control signal and comprising an input terminal for receiving the first control signal and an output terminal for transmitting the second control signal,
   at least a first chip pad connected to the output terminal of the first operation unit and formed on the first surface of the driver chip, and
   at least a second chip pad connected to the input terminal of the first operation unit and formed on the second surface of the driver chip, and
   wherein the plurality of signal lines of the display panel comprises a plurality of data lines, each of which comprises one end connected to one of the pixels, and a terminal pad formed at the other end and connected to the first chip pad.

3. The display device of claim 2, wherein the wire film comprises:
   a wire film body formed by a flexible film, and
   a plurality of signal lines formed over a surface of the wire film body and each comprising a first connection pad and a second connection pad,
   wherein the first connection pad and the second connection pad are connected to the second chip pad and a terminal pad of the control circuit board, respectively.

4. The display device of claim 3, wherein the wire film further comprises an insulating layer covering the signal lines.

5. The display device of claim 3, wherein a bump is formed between the first chip pad and the first connection pad of the signal line of the wire film.

6. The display device of claim 3, wherein a bump is formed between the second chip pad and the terminal pad of the signal line of the display panel.

7. The display device of claim 2, wherein a through silicon via is formed between the first operation unit and at least one of the first and second chip pads.

8. The display device of claim 1, wherein the display panel further comprises an auxiliary circuit formed in the peripheral area and connected to the plurality of pixels and an auxiliary circuit signal line interconnecting the auxiliary circuit and the driver chip package,
   wherein the control circuit board is configured to generate a third control signal and configured to transfer the third control signal to the driver chip package, and
   wherein the driver chip package is configured to generate a fourth control signal base on the third control signal and configured to transfer the fourth control signal to the auxiliary circuit signal line.

9. The display device of claim 8, wherein the driver chip further comprises:
   a second operation unit configured to generate the fourth control signal based on the third control signal,
   at least a third chip pad formed on the first surface of the driver chip and configured to transfer the fourth control signal to the auxiliary circuit signal line, and
   at least a fourth chip pad formed on the second surface of the driver chip and configured to transfer the third control signal to the second operation unit, and
   wherein the auxiliary circuit signal line includes a plurality of auxiliary circuit data lines, each of which comprises one end connected to the auxiliary circuit, and another terminal pad connected to the third pad.

10. The display device of claim 1, wherein the driver chip comprises:
    a fifth chip pad formed on the first surface of the driver chip to be connected to the display panel,
    a sixth chip pad formed on the second surface of the driver chip to be connected to the wire film, and
    a conductor filler passing through the driver chip and interconnecting the fifth chip pad and the sixth pad, and
    wherein the control circuit board is configured to generate a fifth control signal, and the sixth chip pad, the conductor filler and the fifth chip pad are configured to transfer the fifth control signal the display panel.

11. The display device of claim 1, further comprising an auxiliary wire film which connects the control circuit board and the display panel and is configured to directly transfer a sixth control signal generated from the control circuit board to the display panel.

12. The display device of claim 11, wherein the display device is configured to transfer the sixth control signal from the control circuit board to the display panel without passing the driver chip package.

13. The display device of claim 11, wherein the auxiliary wire film comprises one end fixed to the display panel and located between an edge of the display panel and the driver chip.

14. The display device of claim 1, wherein the display area comprises a first sub display area formed at a part of the display area and a second sub display area formed at another part except for the part formed with the first sub display area, and wherein an additional driver chip package is provided, wherein the driver chip package is connected to a plurality of pixels formed in the first sub display area through the signal lines, and the additional chip package is connected to the pixels formed in the second sub display area through the signal lines.

15. The display device of claim 11, wherein the auxiliary wire film overlaps the wire film.

16. The display device of claim 1, wherein the driver chip is electrically connected to the control circuit board via the wire film.

17. The display device of claim 1, wherein the driver chip does not directly contact the control circuit board.

18. The display device of claim 1, wherein the display panel is electrically connected to the control circuit board via the driver chip package.

19. The display device of claim 1, wherein the display panel does not directly contact the control circuit board.

20. The display device of claim 1, wherein the driver chip is sandwiched between the display panel and the wire film.

* * * * *